US010879922B2

(12) United States Patent
Deutscher et al.

(10) Patent No.: US 10,879,922 B2
(45) Date of Patent: Dec. 29, 2020

(54) TIME-BASED, CURRENT-CONTROLLED PAIRED OSCILLATOR ANALOG-TO-DIGITAL CONVERTER WITH SELECTABLE RESOLUTION

(71) Applicant: Microchip Technology Incorporated, Chandler, AZ (US)

(72) Inventors: Neil Deutscher, Phoenix, AZ (US); Bryan Kris, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/534,199

(22) Filed: Aug. 7, 2019

(65) Prior Publication Data

US 2020/0059239 A1 Feb. 20, 2020

Related U.S. Application Data

(60) Provisional application No. 62/719,002, filed on Aug. 16, 2018.

(51) Int. Cl.
*H03M 1/12* (2006.01)
*H03M 1/50* (2006.01)
*H03M 1/16* (2006.01)

(52) U.S. Cl.
CPC .......... *H03M 1/50* (2013.01); *H03M 1/1245* (2013.01); *H03M 1/164* (2013.01)

(58) Field of Classification Search
CPC ...... H03M 1/50; H03M 1/1245; H03M 1/164; H03M 1/60; H03M 1/12; H03M 1/00
USPC ................................................. 341/155, 166
See application file for complete search history.

(56) References Cited

U.S. PATENT DOCUMENTS

| 5,521,556 | A | * | 5/1996 | O'Shaughnessy ... H03K 3/0315 331/1 R |
| 8,022,714 | B2 | * | 9/2011 | Bartling ............. G01R 31/3167 324/658 |
| 8,970,421 | B1 | * | 3/2015 | Gao ....................... G04F 10/005 341/166 |
| 9,397,692 | B1 | | 7/2016 | Zanbaghi et al. |
| 9,903,892 | B2 | * | 2/2018 | Zhang .................. G01R 19/252 |
| 2003/0155903 | A1 | | 8/2003 | Gauthier et al. ........... 324/76.41 |
| 2005/0062482 | A1 | * | 3/2005 | Vincent ................. G04F 10/005 324/617 |

(Continued)

FOREIGN PATENT DOCUMENTS

GB 2502557 A 12/2013

OTHER PUBLICATIONS

International Search Report and Written Opinion, Application No. PCT/US2019/045619, 14 pages, dated Nov. 25, 2019.

*Primary Examiner* — Jean B Jeanglaude
(74) *Attorney, Agent, or Firm* — Slayden Grubert Beard PLLC

(57) ABSTRACT

An analog to digital converter (ADC) includes voltage inputs, a transconductor configured to convert the voltage inputs into currents, current-controlled oscillators, a counter, and digital logic. The current-controlled oscillators propagate respect currents from the transconductor. The counter is configured to count repeated traversal of one or more oscillators. The digital logic is configured to, based upon results from the counter, provide a code configured to indicate a value of associated voltage input.

16 Claims, 2 Drawing Sheets

(56) References Cited

U.S. PATENT DOCUMENTS

| | | | |
|---|---|---|---|
| 2006/0273831 A1* | 12/2006 | Maksimovic | H03M 1/1042 |
| | | | 327/103 |
| 2012/0249198 A1* | 10/2012 | Sinha | H03L 7/089 |
| | | | 327/157 |
| 2016/0069939 A1* | 3/2016 | Zhang | G01R 19/252 |
| | | | 324/76.39 |
| 2018/0048324 A1 | 2/2018 | Samad et al. | |

* cited by examiner

TIME-BASED, CURRENT-CONTROLLED PAIRED OSCILLATOR ANALOG-TO-DIGITAL CONVERTER WITH SELECTABLE RESOLUTION

RELATED APPLICATIONS

This application claims priority to U.S. Provisional Patent Application No. 62/719,002 filed Aug. 16, 2018, the contents of which are hereby presented in their entirety.

TECHNICAL FIELD

The present disclosure relates to analog to digital converters (ADC), in particular a time-based, current-controlled paired oscillator analog-to-digital converter with selectable resolution.

BACKGROUND

Many different kinds of ADCs exist and their use often depends on a given application. ADCs may vary according to a bit size, wherein the analog signal will be digitized into $2^n$ different digital values, wherein the ADC is an n-bit converter, using n-bits to represent the range of analog values. Moreover, ADCs may include an input range for the analog signal. The lowest digitized output of the ADC (e.g., 00000000 for an 8-bit ADC) may correspond to the lower limit of analog signal input. The highest digitized output of the ADC (e.g., 11111111 for an 8-bit ADC) may correspond to the upper limit of analog signal input. Such example values may specify positive or unsigned values, though two's complement binary enumeration may be used instead. An ADC may have a defined bandwidth that may correspond to a sampling rate, or how often the analog signal is sampled. The ADC may output values according to varying degrees of linearity.

Digital comparators and ADCs may be constructed from parallel digital delay lines, wherein bias signals or currents from input voltages may be used to power respective digital delay lines that propagate an input value. The digital delay line with a higher bias signal may propagate an input value faster than another digital delay line with a lower bias signal. The digital delay lines are of a sufficient length to allow adequate comparisons. However, inventors of embodiments of the present disclosure have discovered embodiments that may be used to build fast ADCs with a very small surface die area required to implement the ADCs, compared to using an entire digital delay line of the length used in other ADCs. Furthermore, embodiments of the present disclosure may use less power than using an entire digital delay line of the length used in other ADCs. In addition, embodiments of the present disclosure may solve problems of integral non-linearity and other noise present in using an entire digital delay line of the length used in other ADCs. Also, embodiments of the present disclosure may include variable resolution and internal calibration, which may not be available or easily implemented when using an entire digital delay line of the length used in other ADCs.

SUMMARY

Embodiments of the present disclosure include an ADC converter. The ADC converter may include first and second voltage inputs. The ADC converter may include a transconductor. The transconductor may be implemented by digital circuitry, analog circuitry, or any combination thereof. The transconductor may be configured to convert the first voltage input into a first current and to convert the second voltage input into a second current. The ADC converter may include current-controlled oscillators. The current-controlled oscillators may be implemented by digital logic, analog logic, or any combination thereof. A first current-controlled oscillator may be configured to receive the first current and propagate the first current through the first current-controlled oscillator. A second current-controlled oscillator may be configured to receive the second current and propagate the second current through the second current-controlled oscillator. The ADC converter may include a first counter configured to count repeated traversal of the first oscillator by the first current. The first counter may be implemented by digital logic, analog logic, instructions for execution by a processor, or any combination thereof. The ADC converter may include digital logic configured to, based upon results from the first counter, provide a code configured to indicate a value of the first voltage input.

In combination with any of the above embodiments, the oscillators may be implemented by, for example, an odd number of inverting logic.

In combination with any of the above embodiments, the code may be configured to indicate the value of the first voltage input is expressed as whether the first voltage input is greater than the second voltage input.

In combination with any of the above embodiments, the code may be configured to indicate the value of the first voltage input is expressed as an analog to digital conversion of the differential voltage between the first voltage input and the second voltage input.

In combination with any of the above embodiments, the ADC may include a second counter configured to count repeated traversal of the second current-controlled oscillator by the second current.

In combination with any of the above embodiments, the digital logic may be further configured to read the first counter upon the second counter reaching a predefined value. In combination with any of the above embodiments, the digital logic may be further configured to read the second counter upon the first counter reaching a predefined value.

In combination with any of the above embodiments, the counters may be configured to count up the predefined value or count down from another predefined value to the predefined value. In combination with any of the above embodiments, the digital logic may be further configured to adjust accuracy of the ADC by adjusting the predefined value. In combination with any of the above embodiments, the accuracy of the ADC may be increased by increasing the predefined value to which the counters may count up. In combination with any of the above embodiments, the accuracy of the ADC may be increased by increasing another predefined value from which the counters may count down to the predefined value. In combination with any of the above embodiments, the accuracy of the ADC may be decreased by decreasing the predefined value to which the counters may count up. In combination with any of the above embodiments, the accuracy of the ADC may be decreased by decreasing another predefined value from which the counters may count down to the predefined value.

In combination with any of the above embodiments, the digital logic may be further configured to, based upon results from the first counter and the second counter, provide the code, the code further configured to indicate a differential voltage between the first voltage input and the second voltage input.

In combination with any of the above embodiments, the digital logic may be further configured to select the first current-controlled oscillator from a first group of current-controlled oscillators and to select the second current-controlled oscillator from a second group of current-controlled oscillators.

In combination with any of the above embodiments, the digital logic may be further configured to select the first current-controlled oscillator and the second current-controlled oscillator based on a comparison of the first current-controlled oscillator and the second current-controlled oscillator.

In combination with any of the above embodiments, a microcontroller, power switch, or

DETAILED DESCRIPTION

Figure 1:
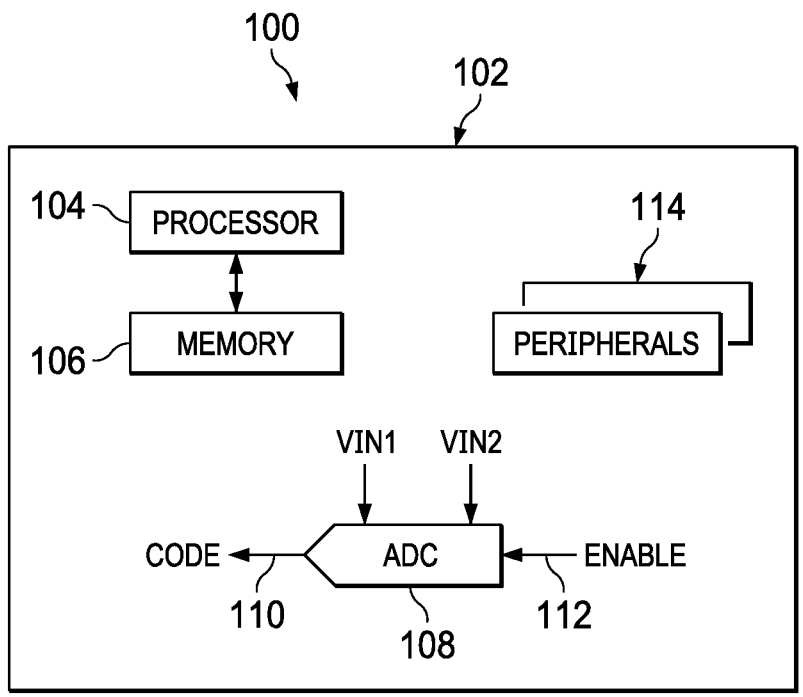
FIG. 1 is an illustration of an example system that may use ADCs that are time-based, current-controlled, featuring selectable resolution and implemented with paired oscillators, according to embodiments of the present disclosure.

FIG. 1 is an illustration of an example system 100 that may use ADCs that are time-based, current-controlled, featuring selectable resolution and implemented with paired oscillators, according to embodiments of the present disclosure. Such an ADC may include, for example, ADC 108.

System 100 may include any suitable context of an electronic device or electronic devices that may use an ADC. For example, system 100 may include a microcontroller, power converter, power controller, computer, network, mobile device, smart phone, appliance, vehicle, electronic component, or other suitable electronic device or devices. In the example of FIG. 1, system 100 may include a microcontroller 102. Microcontroller 102 may include a processor 104 coupled to a memory 106. Furthermore, microcontroller 102 may include one or more peripherals 114. Peripherals 114 may include, for example, power controllers, memory management units, timers, pulse width modulation controllers or generators, configurable logic cells, oscillators, or any other suitable functional block. Peripherals 114 may be core-independent peripherals (CIPs), wherein operation of peripherals 114, once possibly initiated by processor 104, may be performed independently of processor 104.

In one embodiment, ADC 108 may be configured to convert a voltage input or inputs to a digital output. In another embodiment, ADC 108 may implement a comparator, wherein an output is provided that indicates whether one of two voltage inputs is greater than the other. For example, ADC 108 may receive VIN1 and VIN2 as inputs. Thus, ADC 108 may be configured to convert the differential voltage between VIN1 and VIN2 to a digital output code 110. Furthermore, ADC 108 may be configured to output digital output code 110 based on a comparison of whether VIN1 is greater than VIN2. In another example (not shown), VIN2 may be connected to ground internally or externally to ADC 108. In such an example, ADC 108 may be configured to convert the voltage value of VIN1 to digital output code 110. Furthermore, ADC 108 may be configured to output digital output code 110 as an indicator of whether the voltage value of VIN1 is positive or negative.

ADC 108 may be used by any suitable portion of system 100. For example, ADC 108 may be called by processor 104 or one of peripherals 114. Furthermore, VIN1 and VIN2 may be provided by any suitable portion of system 100, such as by processor 104, peripherals 114, or routed from input pins (not shown) on microcontroller 102 from another portion (not shown) of system 100. The operation of ADC 108 may be continuous or may be on-demand using, for example, an enable signal 112. Enable signal 112 may be provided by any suitable entity, such as processor 104 or peripherals 114. Upon receipt of enable signal 112 indicating that operation is to begin, ADC 108 may be configured to generate code 110 based upon its inputs. Enable signal 112 may also include configuration information. Such configuration information may include a selection of whether ADC 108 is to operate as an analog to digital converter or a comparator. Furthermore, such configuration information may include a designation of resolution of operation of ADC 108, such as how many bits are to be used in generating code 110. In addition, enable signal 112 may include an analog input range, an analog input minimum, an analog input maximum, calibration information, an instruction to run a self-calibration, or any other suitable information.

In one embodiment, ADC 108 may be implemented using paired oscillators. Furthermore, ADC 108 may be implemented as a time-based ADC. Also, ADC 108 may be implemented as a current-controlled ADC. In addition, ADC 108 may include selectable oscillators. Furthermore, ADC 108 may include features for selectable resolution. Also, ADC 108 may include calibration mechanisms. More detailed implementations of ADC are shown below within the context of FIGS. 2A, 2B, and 3.

ADC 108 may be configured to operate as an analog to digital converter, a comparator, or both an analog to digital converter and comparator. ADC 108 may include control logic defining whether ADC 108 is to operate as an analog to digital converter or a comparator. In one embodiment, ADC 108 may operate as an analog to digital converter or comparator selectively based upon enable signal 112.

Figure 2A:
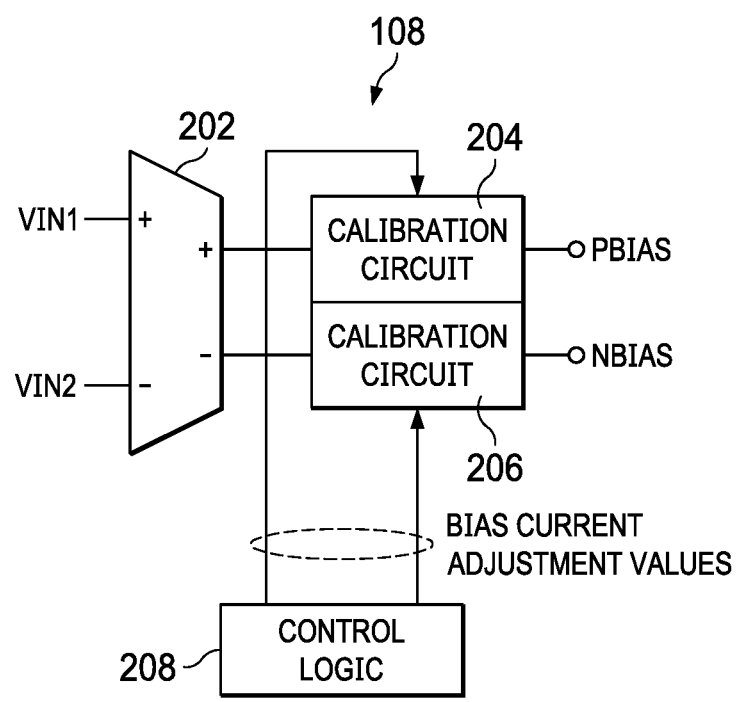
FIGS. 2A and 2B are more detailed illustrations of an example ADC, according to embodiments of the present disclosure.
Figure 2B:
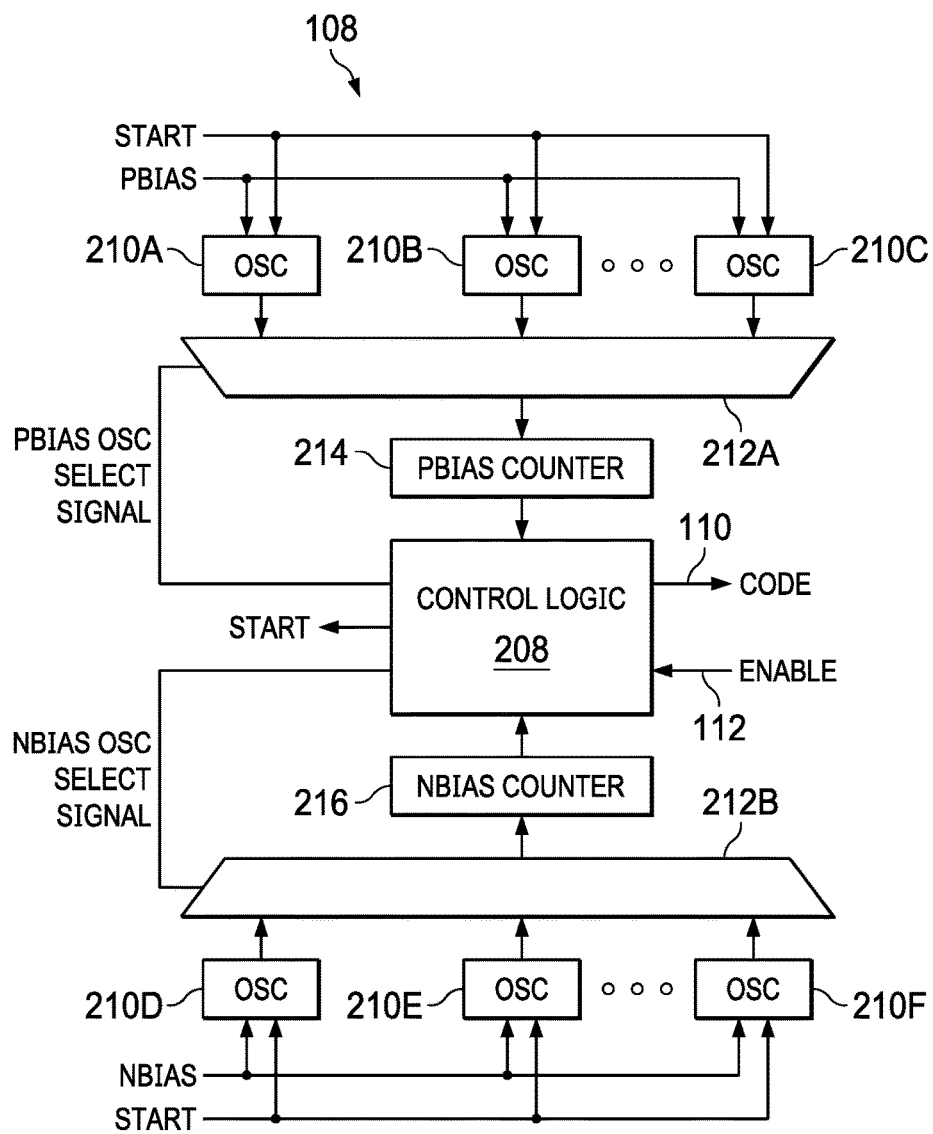

FIGS. 2A and 2B are more detailed illustrations of an example implementation of ADC 108, according to embodiments of the present disclosure.

ADC 108 may include a transconductor 202. Transconductor 202 may be implemented in any suitable manner, such as a combination of analog and digital circuitry. Transconductor 202 may include a positive input and a negative input. Thus, transconductor 202 may be configured to receive a differential voltage input. In one embodiment, transconductor 202 may receive VIN1 through its positive input. In another embodiment, transconductor 202 may receive VIN2 through its negative input. In yet another embodiment, transconductor 202 may be connected to ground through its negative input. Such a ground may be internal or external to ADC 108.

ADC 108 may be configured to generate a positive output bias current and a negative output bias current. The current may be conditioned through any suitable conditioning circuit. The positive output bias current as provided to the rest of ADC 108 may be referred to as pbias. The negative output bias current as provided to the rest of ADC 108 may be referred to as nbias. Transconductor 202 may thus implement an input circuit for ADC 108.

Output of transconductor 202 may be processed through any suitable conditioning circuit, or no conditioning circuit at all, to yield pbias and nbias. For example, ADC 108 may include a calibration circuit 204 configured to condition a positive output bias current generated by transconductor 202 to yield pbias. In another example, ADC 108 may include a calibration circuit 206 configured to condition a negative output bias current generated by transconductor 202 to yield nbias. In yet another example (not shown), ADC 108 may include a single calibration circuit, such as calibration circuit 204, configured to condition both a negative output bias current generated by transconductor 202 to yield nbias and a positive output bias current generated by transconductor 202 to yield pbias. Conditioning circuits 204, 206 may be implemented by any suitable combination of analog and digital circuitry. Conditioning circuits 204, 206 may be configured to perform any suitable conditioning on output of transconductor 202 to yield pbias and nbias. For example, conditioning circuits 204, 206 may be configured to adjust current outputs of transconductor 202 up or down based upon calibration information. Such calibration information may be stored in any suitable part of ADC 108, such as within calibration circuits 204, 206.

In one embodiment, ADC 108 may include control logic 208. Control logic 208 may be implemented by analog circuitry, digital circuitry, instructions for execution by a processor, or any suitable combination thereof. Control logic 208 may be configured to store bias current adjustment values to calibrate or adjust output of transconductor 202 to yield pbias and nbias. Control logic 208 may be configured to issue commands to calibration circuits 204, 206 or to provide adjustment values to calibration circuits 204, 206 to adjust output of transconductor 202 to yield pbias and nbias. For example, control logic 208 may write adjustment values to a register, which may be read by calibration circuits 204, 206. Calibration circuits 204, 206 may be configured to apply adjustment values such that perfectly equal input values of VIN1 and VIN2 yield perfectly equal nbias and pbias values. Values for bias current adjustment values may be determined by applying a same voltage to both inputs of transconductor 202. The results of output of transconductor 202 may be evaluated to determine if the positive and negative outputs are the same. If there is a difference in the outputs, bias current adjustment values may be determined that, when applied to the outputs, would cause pbias and nbias to be the same. Such bias current adjustment values may be determined during manufacturing, validation, or test of ADC 108, during a self-calibration mode, or during any other suitable time.

In one embodiment, ADC 108 may include an oscillator 210A for evaluating pbias and an oscillator 210D for evaluating nbias. In another embodiment, ADC 108 may include multiple, selectable oscillators such as oscillators 210A, 210B, 210C for evaluating pbias and multiple, selectable oscillators such as oscillators 210D, 210E, 210F for evaluating nbias. Although three such oscillators 210A 210B, 210C for evaluating pbias and three such oscillators 210D, 210E, 210F for evaluating nbias are shown in FIG. 2B, ADC 108 may include any suitable number of oscillators for evaluating nbias and pbias.

Oscillators 210 may be implemented in any suitable manner. More detailed implementations of oscillators 210 are discussed further below within the context of FIG. 3. Each instance of oscillators 210 may be implemented in the same manner. In one embodiment, oscillators 210 may be implemented by a ring oscillator. Oscillators 210 may be implemented by, for example, a circuit including a series of inverting logic elements such as NOT gates, inverters, or other suitable logic. The number of logic operators may be odd.

Each of oscillator 210 may receive as input a start signal and a bias signal. Oscillators 210A, 210B, 210C may be configured to receive the start signal from control logic 208 and to receive the pbias signal from transconductor 202 through calibration circuit 204. Oscillators 210D, 210E, 210F may be configured to receive the start signal from control logic 208 and to receive the nbias signal from transconductor 202 through calibration circuit 206.

Oscillators 210 may be configured to generate an output pulse, change in polarity, low-voltage-to-high-voltage transition, high-voltage-to-low-voltage-transition, or any other suitable signal periodically. For example, each of oscillators 210 may be configured to issue an output that is a square wave oscillating between two voltage levels representing true (or logic high) and false (or logic low). The odd number of inverting logic elements in oscillator 210 may cause the square wave output; an even number of such inverting logic elements might not issue such an output.

The rate at which oscillators 210 periodically generate such a signal may be dependent upon a magnitude of the current of the bias signal received at the individual oscillator 210. The larger the bias current, the more frequently the oscillator 210 may generate the signal. The smaller the bias current, the less frequently the oscillator 210 may generate the signal. Oscillator 210 may be configured to start generating the signal upon receipt of the start signal from control logic 208.

The start signal may be used as an initial value in the chain of inverting elements within each of oscillators 210. The start signal may be propagated through the ring of logic elements in oscillator 210, being inverted at each inverting element. The inverting elements may each be powered by the bias signal received at oscillator 210. The speed at which inverting elements may invert and propagate signals may be related to the magnitude of the bias signal received.

As discussed above, ADC 108 may include two groups of oscillators. Oscillators 210A, 210B, 210C may be configured to receive the pbias signal from transconductor 202 through calibration circuit 204, and oscillators 210D, 210E, 210F may be configured to receive the nbias signal from transconductor 202 through calibration circuit 206. Although three such instances of oscillators 210 are shown in FIG. 2B as receiving the pbias signal and three such instances of oscillators 210 are shown in FIG. 2B as receiving the nbias signal, any number of instances of oscillators 210 may be included in ADC 108 receive the nbias signal or the pbias signal. In one embodiment, a single one of the oscillators 210 receiving the pbias signal (such as oscillators 210A, 210B, 210C) may be used to evaluate the pbias signal. In another embodiment, a single one of the oscillators 210 receiving the nbias signal (such as oscillators 210D, 210E, 210F) may be used to evaluate the nbias signal.

ADC 108 may include any suitable mechanism for selecting which of oscillators 210 are to be used for evaluating the pbias or nbias signals. For example, ADC 108 may include a multiplexer 212A for selecting which of oscillators 210A, 210B, 210C are to be used to evaluate the pbias signal. Furthermore, ADC 108 may include a multiplexer 212B for selecting which of oscillators 210D, 210E, 210F are to be used to evaluate the nbias signal. Control logic 208 may be configured to issue a pbias oscillator select signal to multiplexer 212A to select which of oscillators 210A, 210B, 210C are to be used to evaluate the pbias signal. Furthermore, control logic 208 may be configured to issue an nbias oscillator select signal to multiplexer 212B to select which of oscillators 210D, 210E, 210F are to be used to evaluate the nbias signal. Any suitable selection mechanism may be used instead of multiplexers 212, such as a switch, switch fabric, or control logic.

ADC 108 may be configured to select which of oscillators 210 are to be used for evaluating the pbias or nbias signals based upon any suitable criteria. In one embodiment, ADC 108 may be configured to select one of oscillators 210A, 210B, 210C and one of oscillators 210D, 210E, 210F based upon how closely performance of the selected oscillators match. Oscillators 210 may each be implemented in the same way. However, in practice, imperfections and slight variations in the implementations of oscillators 210 may cause slight discrepancies in performance between each of oscillators 210. These may arise during the manufacturing process. Oscillators 210 may be tested by applying a same bias signal to each of oscillators 210. This may be performed, for example, during production, validation, or self-calibration of oscillators 210. Given a same bias voltage to each of oscillators 210, the frequency of output signals from each of oscillators 210 may be recorded and evaluated. The frequency of each of oscillators 210A, 210B, 210C may be compared with the frequency of each of oscillators 210D, 210E, 210F. The pair of oscillators—one from oscillators 210A, 210B, 210C and one from oscillators 210D, 210E, 210F—with the most closely matching frequency may be subsequently selected as the oscillators 210 to be used to respectively evaluate the pbias and nbias signals. An indication of which of oscillators 210 to select may be stored in, for example, a register or other setting available to control logic 208. During use of ADC 108, control logic 208 may issue selection signals to multiplexers 212 according to such information.

ADC 108 may include any suitable mechanism to measure the frequencies or speed of oscillators 210. In one embodiment, ADC 108 may include a pbias counter 214 to measure the frequency or speed of the selected one of oscillators 210A, 210B, 210C. The frequency or speed may be measured according to output signals generated by the selected one of oscillators 210A, 210B, 210C. In another embodiment, ADC 108 may include an nbias counter 216 to measure the frequency or speed of the selected one of oscillators 210D, 210E, 210F. The frequency or speed may be measured according to output signals generated by the selected one of oscillators 210D, 210E, 210F. Output of the selected one of the selected one of oscillators 210A, 210B, 210C may be input into pbias counter 214. Output of the selected one of oscillators 210D, 210E, 210F may be input into nbias counter 216. Pbias counter 214 and nbias counter 216 may be reset when operation of ADC 108 is initiated to compare nbias and pbias signals. Pbias counter 214 and nbias counter 216 may be implemented in any suitable manner. For example, pbias counter 214 and nbias counter 216 may be implemented by count-up or count-down counters. Pbias counter 214 and nbias counter 216 may be configured to increment (in a count-up implementation) or decrement (in a count-down implementation) upon, for example, a square wave input, a rising edge, or a falling edge on input therein. Pbias counter 214 and nbias counter 216 may be configured to terminate counting when, for example, one of pbias counter 214 or nbias counter 216 reaches a maximum value, a minimum value, a preset value, or upon expiration of another timer (not shown). Upon termination of operation one of pbias counter 214 or nbias counter 216, the other of pbias counter or nbias counter 216 may be configured to terminate its operation. Such a termination may be performed by, for example, control logic 208. Termination of operation may be performed by control logic 208 reading values from the respective counter.

The maximum, minimum, or other designated value to which pbias counter 214 and nbias counter 216 are to count up to or down from may be designated in any suitable manner, such as being stored in a register, pre-programmed, hard-wired, received from another element of ADC 108, or another element of system 100. In one embodiment, upon reaching a maximum, minimum, or other designated value, pbias counter 214 and nbias counter 216 may be configured to issue a notification, overflow, or other signal that the respective counter has finished counting to control logic 208. In another embodiment, control logic 208 may be configured to read the values of pbias counter 214 and nbias counter 216 at a predesignated time. The maximum value to which counters 214, 216 are to count up to, or an initial value from which counters 214, 216 are to count down from, or any other limitation on the counting of counters 214, 216 may be designated by a selected resolution of measurement by ADC 108. The longer that counters 214, 216 are allowed to run—by, for example, setting a higher maximum value (for count-up) or a higher initial value (for count-down)—the more accurate the measurement by ADC 108 will be. However, such a measurement may take more time. The less time for which counters 214, 216 are allowed to run—by, for example, setting a lower maximum value (for count-up) or a lower initial value (for count-down)—the less accurate the measurement by ADC 108 will be. However, such a measurement may be faster. Thus, a value of the maximum value, initial value, or other control or limitation on how long counters 214, 216 are allowed to run may determine the resolution of the accuracy of measurements performed by ADC 108.

In one embodiment, upon receipt of an indication that either pbias counter 214 and nbias counter 216 has finished counting, or that a predetermined amount of time has elapsed, control logic 208 may be configured to read, pause, or disable the counting of the other, non-finishing counter. Pbias counter 214 and nbias counter may be synchronized by any suitable available clock (not shown).

Although a single instance of transconductor 202, a single pair of counters 214, 216, a single pair of multiplexers 212, a particular number of oscillators 210, and a single pair of input voltages (VIN1, VIN2) are illustrated in FIGS. 2A and 2B, ADC 108 may be configured to provide analog-to-digital conversion or comparison of multiple pairs of differential voltage inputs. Such analog-to-digital conversion or comparison of multiple pairs of differential voltage inputs may be performed in parallel. To perform such analog-to-digital conversion or comparison of multiple pairs of differential voltage inputs, ADC 108 may include additional instances (not shown) of any of counters 214, 216, multiplexers 212, oscillators 210, input voltages, and control logic 208. An indication of which set of instances of these are to be used may be provided in, for example, enable signal 112.

Upon termination of counting by pbias counter 214 or nbias counter 216, control logic 208 may be configured to evaluate the values included in pbias counter 214 and nbias counter 216. The values included in pbias counter 214 and nbias counter 216 may be used to determine the value of nbias or pbias and, by further reference, VIN1 and VIN2. Control logic 208 may use any suitable mechanisms or techniques to evaluate the values of pbias counter 214 and nbias counter 216 to determine the magnitude of nbias and pbias and, furthermore, VIN1 and VIN2. The magnitude may be absolute, relative, offset, or scaled. Control logic 208 may be configured to generate any suitable code 110 for identifying values of nbias, pbias, VIN1, or VIN2. For example, code 110 may be generated as a thermometer code. Code 110 may be signed, unsigned, based on an offset value, defined by absolute values within a range, or defined by relative values from a reference.

In one embodiment, wherein ADC 108 is configured to operate as a comparator, ADC 108 may be configured to generate code 110 to indicate that VIN1 is greater than VIN2 if pbias counter 214 finishes counting sooner than nbias counter 216, or if, upon termination of counting, the value of pbias counter 214 is greater than bias counter 216 (if counting up) or the value of pbias counter 216 is less than bias counter 216 (if counting down). In such a case, the selected one of oscillators 210A, 210B, 210C generated more counts in pbias counter 214 than the selected one of oscillators 210D, 210E, 210F generated in nbias counter 216. The higher count in pbias counter 214 may reflect that pbias was greater than nbias, causing the selected one of oscillators 210A, 210B, 210C to operate faster than the selected one of oscillators 210D, 210E, 210F.

In one embodiment, wherein ADC 108 is configured to provide an analog to digital conversion of VIN1 and VIN2, code 110 may be generated through any suitable technique. For example, code 110 may be generated with reference to VIN2 as a known reference value. For example, VIN2 may be connected to ground or to a known voltage source. For operation over a given time period, VIN2, as translated into nbias by transconductor 202, may be known to generate a given, known, or expected value of signals collected in nbias counter 216. Thus, when counting operation is ceased in ADC 108, the value of nbias counter 216 may be read and compared against the expected or known value of nbias counter 216. The degree to which nbias counter 216 did not finish counting, because pbias counter 214 finished counting first, may be evaluated. Such a degree of difference between measured and known values of nbias counter 216 may be translated into a difference of bias current, and may be translated into a difference of input voltage that generated such bias current. The degree of difference may be evaluated through any suitable calculation, look-up table, or other suitable technique. In another example, upon completion of counting, values of nbias counter 216 and pbias counter 214 may be read. A degree of difference between the values of these counters may be translated into a difference of bias current, and may be translated into a difference of input voltage that generated such bias current. The degree of difference may be evaluated through any suitable calculation, look-up table, or other suitable technique.

Figure 3:
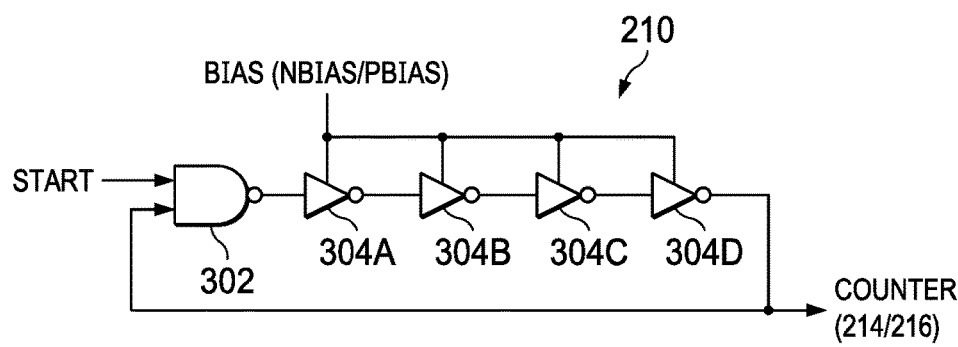
FIG. 3 is a more detailed illustration of an example oscillator for use in an ADC, according to embodiments of the present disclosure.

FIG. 3 is a more detailed illustration of an example implementation of oscillator 210, according to embodiments of the present disclosure.

Oscillator 210 may be a ring oscillator. Oscillator 210 may include an input for a start signal and an input for a bias signal. The bias signal may be, for example, nbias or pbias. The bias signal may be used to provide power to one or more logic or other elements of oscillator 210.

Oscillator 210 may include logic 302 such as a NAND gate. Logic 302 may include inputs for the start signal and for an output of oscillator 210, connected in a feedback manner. Output of logic 302 may be provided to other inverting logic elements 304. Any suitable number of inverting logic elements 304 may be used. The number of inverting logic elements 304 may be even, such that the total number of logic elements, including logic 302, is odd and the elements are inverting. For example, four inverters may be used to implement inverting logic elements 304A-304D. Output from inverting logic element 304D may be used as output of oscillator 210 to, for example, pbias counter 214 or nbias counter 216, as appropriate.

More or fewer inverting elements may be used in series in oscillator 210 as long as an odd number of total inverting elements, include logic 302 and elements 304, is used. The output of oscillator 210 from inverting logic element 304D may be a logical NOT of the first input (such as the start signal or the previous value output from logic element 304D. Oscillator 210 may propagate signals through the inverting logic elements at a speed proportional to the power provided to operate the individual elements of ring oscillator 108. Such power may be the bias signal. The logical NOT of logic 302 is not propagated to the output of oscillator 210 instantaneously. The time needed for an individual inverting element of oscillator 210 to recognize an input and output its inverse may be related to the gate delay or propagation delay of the individual inverting element. The total amount of propagation delays of these elements of oscillator 210 may be the time needed for a given input to be inverted throughout oscillator 210 and output therefrom. The gate delay for an individual element may be related to the time for a gate capacitance of a transistor of the element to charge before current can flow between the source and the drain. Adding additional inverters or NOT gates to the chain of inverting elements of oscillator 210 may increase the total propagation delay, thus reducing the frequency of oscillation. Moreover, removing inverters or NOT gates from the chain of inverting elements of oscillator 210 may decrease the total propagation delay, thus increasing the frequency of oscillation. Furthermore, increasing the supply power through the bias current to the individual elements of oscillator 210 may decrease the gate delay, thus decreasing overall propagation delay and increasing the frequency of oscillation. Decreasing the supply power to the individual elements of oscillator 210 may increase the gate delay, thus increasing overall propagation delay and decreasing the frequency of oscillation. Accordingly, the frequency of oscillator 210 is related to the input power received through the bias current. As discussed above, ADC 108 may be configured to supply pbias to oscillators 210A, 210B, 210C and nbias to oscillators 210D, 210E, 210F to compare or measure the resultant speed or frequencies of the selected oscillators, and to use differences between the measurements determine the differences in the voltages VIN1 and VIN2.

Returning to FIG. 2, code 110 may be generated to reflect differences between the values of pbias counter 214 and nbias counter 216. Code 110 may be further translated, shifted, scaled, or otherwise modified to produce a more useful digital representation of VIN1, VIN2, or a comparison of the two.

Multiple instances of oscillators 210 may be implemented in ADC 108 because of the relatively small size needed to implement a ring oscillator. By using oscillators 210 implemented as ring oscillators, rather than implementing ADC with linear digital delay lines, the area needed for ADC 108 may be reduced by an order of magnitude. Implementations using such linear digital delay lines may require many more delay elements. Thus, integral non-linearity errors may be reduced as such errors are often proportional to the square root of the number of delay cells. The implementation may be simplified compared to those using linear delay lines as the number of delay cells used are reduced from hundreds, to approximately ten.

Additions, changes, modifications, or other permutations of this disclosure may be made according to the knowledge, skill, and understanding of one of skill in the art.

The invention claimed is:

1. An analog to digital converter (ADC), comprising:
a first voltage input;
a second voltage input;
a transconductor configured to:
convert the first voltage input into a first current; and
convert the second voltage input into a second current;
a first current-controlled oscillator configured to receive the first current and propagate the first current through the first current-controlled oscillator;
a second current-controlled oscillator configured to receive the second current and propagate the second current through the second current-controlled oscillator;
a first counter configured to count repeated traversal of the first oscillator by the first current; and
digital logic configured to, based upon results from the first counter, provide a code configured to indicate a value of the first voltage input;
wherein:
the ADC further comprises a second counter configured to count repeated traversal of the second current-controlled oscillator by the second current; and
the digital logic is further configured to read the first counter upon the second counter reaching a predefined value.

2. The ADC of claim 1, wherein the code configured to indicate the value of the first voltage input is expressed as whether the first voltage input is greater than the second voltage input.

3. The ADC of claim 1, wherein the code configured to indicate the value of the first voltage input is expressed as an analog to digital conversion of the differential voltage between the first voltage input and the second voltage input.

4. The ADC of claim 1, wherein the first current-controlled oscillator includes a series of logic including an odd plurality of inverting logic.

5. The ADC of claim 1, wherein the digital logic is further configured to select the first current-controlled oscillator from a first group of current-controlled oscillators and to select the second current-controlled oscillator from a second group of current-controlled oscillators.

6. The ADC of claim 5, wherein the digital logic is further configured to select the first current-controlled oscillator and the second current-controlled oscillator based on a comparison of the first current-controlled oscillator and the second current-controlled oscillator.

7. The ADC of claim 1, wherein the digital logic is further configured to adjust accuracy of the ADC by adjusting the predefined value.

8. The ADC of claim 1, wherein the digital logic is further configured to, based upon results from the first counter and the second counter, provide the code, the code further configured to indicate a differential voltage between the first voltage input and the second voltage input.

9. A method, comprising:
converting a first voltage input into a first current; and
converting a second voltage input into a second current;
with a first current-controlled oscillator, receiving the first current and propagating the first current through the first current-controlled oscillator;
with a second current-controlled oscillator configured to receive the second current and propagate the second current through the second current-controlled oscillator;
counting repeated traversal of the first oscillator by the first current; and
based upon results from counting repeated traversal of the first oscillator by the first current, providing a code configured to indicate a value of the first voltage input;
wherein the method further comprises:
counting repeated traversal of the second current-controlled oscillator by the second current; and
stopping the counting upon reaching a predefined value, and adjusting accuracy of the ADC by adjusting the predefined value.

10. The method of claim 9, further comprising indicating with the code whether the first voltage input is greater than the second voltage input.

11. The method of claim 9, further comprising indicating with the code an analog to digital conversion of the differential voltage between the first voltage input and the second voltage input.

12. The method of claim 9, further comprising inverting signals within the first oscillator using an odd plurality of inverting logic.

13. The method of claim 9, further comprising, based upon a count of the traversal of the first oscillator and a count of the traversal of the second oscillator, indicating, with the code, a differential voltage between the first voltage input and the second voltage input.

14. The method of claim 13, further comprising selecting the first current-controlled oscillator from a first group of current-controlled oscillators and selecting the second current-controlled oscillator from a second group of current-controlled oscillators.

15. The method of claim 14, further comprising selecting the first current-controlled oscillator and the second current-controlled oscillator based on a comparison of the first current-controlled oscillator and the second current-controlled oscillator.

16. A system, comprising:
a first voltage source;
a second voltage source; and
an analog to digital converter (ADC), comprising:
a first voltage input;
a second voltage input;
a transconductor configured to:
convert the first voltage input into a first current; and
convert the second voltage input into a second current;
a first current-controlled oscillator configured to receive the first current and propagate the first current through the first current-controlled oscillator;
a second current-controlled oscillator configured to receive the second current and propagate the second current through the second current-controlled oscillator;
a first counter configured to count repeated traversal of the first oscillator by the first current; and
digital logic configured to, based upon results from the first counter, provide a code configured to indicate a value of the first voltage input;
wherein:
the ADC further comprises a second counter configured to count repeated traversal of the second current-controlled oscillator by the second current; and
the digital logic is further configured to read the first counter upon the second counter reaching a predefined value.

* * * * *